United States Patent
Voss

[11] Patent Number: 6,054,727
[45] Date of Patent: Apr. 25, 2000

[54] POWER SEMICONDUCTOR COMPONENT

[75] Inventor: Peter Voss, München, Germany

[73] Assignee: Eupec Europäische Gesellschaft fuer Leistungshalbleiter mbH & Co. KG, Warstein-Belecke, Germany

[21] Appl. No.: 08/566,551

[22] Filed: Dec. 4, 1995

[30] Foreign Application Priority Data

Dec. 2, 1994 [DE] Germany .............................. 44 43 271

[51] Int. Cl.$^7$ ................................................. H01L 29/74
[52] U.S. Cl. ........................... 257/109; 257/171; 257/181
[58] Field of Search ...................... 257/109, 171, 257/181

[56] References Cited

U.S. PATENT DOCUMENTS

| 3,586,932 | 6/1971 | Kokosa | 257/132 |
|---|---|---|---|
| 3,654,529 | 4/1972 | Lord | 257/689 |
| 3,681,667 | 8/1972 | Kokosa | 257/123 |
| 4,080,620 | 3/1978 | Chu | 257/109 |
| 4,810,672 | 3/1989 | Schwarzbauer | 257/712 |

FOREIGN PATENT DOCUMENTS

| 0 242 626 | 10/1987 | European Pat. Off. . |
|---|---|---|
| 0 365 007 A2 | 4/1990 | European Pat. Off. . |
| 0 365 007 A3 | 4/1990 | European Pat. Off. . |
| 36 33 266 | 3/1988 | Germany . |

OTHER PUBLICATIONS

Patent Abstract of Japan No. JP 50–74824 (Naoto), Jul. 26, 1993.

*Primary Examiner*—Mark V. Prenty
*Attorney, Agent, or Firm*—Herbert L. Lerner; Laurence A. Greenberg; Werner H. Stemer

[57] ABSTRACT

A power semiconductor component includes a semiconductor body having a beveled peripheral surface, a cathode electrode and an anode electrode. A materially joined connection between at least the anode electrode and the semiconductor body is not produced by alloying. The anode electrode has a diameter being greater than the cathode electrode and smaller than the semiconductor body.

6 Claims, 1 Drawing Sheet

POWER SEMICONDUCTOR COMPONENT

BACKGROUND OF THE INVENTION

FIELD OF THE INVENTION

The invention relates to a power semiconductor component having a semiconductor body with a beveled peripheral surface, a cathode electrode and an anode electrode, and a materially joined connection between at least the anode electrode and the semiconductor body, which connection is not produced by alloying.

Power semiconductor components of that type have been described, for instance, in Published European Patent Application 0 242 626 A2, corresponding to U.S. Pat. No. 4,810,672, and in German Published, Non-Prosecuted Application DE 36 33 266 A1. Unlike the power semiconductor components used most often, they have an anode electrode, which is joined to the semiconductor body by pressure sintering or diffusion welding, rather than by alloying. The diffusion welding and pressure sintering require a lower temperature but a high pressure, as compared with alloying. As a result, a materially joined connection that is free of holes, cavities or bubbles can be made between the anode electrode and the semiconductor body.

Due to the high pressure when the anode electrode is mounted, heretofore the cathode electrode and the anode electrode have been made congruent with one another. Especially in a power semiconductor component, having a cathode-side surface which has a negative bevel of 4°, for instance, the result is that a relatively large peripheral region of the semiconductor body remains inadequately cooled. That results in a reduced temperature loading capacity and therefore a reduced current-carrying capacity.

SUMMARY OF THE INVENTION

It is accordingly an object of the invention to provide a power semiconductor component, which overcomes the hereinafore-mentioned disadvantages of the heretofore-known devices of this general type, in such a way that the current-carrying capacity is increased.

With the foregoing and other objects in view there is provided, in accordance with the invention, a power semiconductor component, comprising a semiconductor body having a beveled peripheral surface; a cathode electrode and an anode electrode; and a materially joined connection between at least the anode electrode and the semiconductor body, the connection not being produced by alloying; the anode electrode having a diameter being greater than the cathode electrode and smaller than the semiconductor body.

In accordance with another feature of the invention, the cathode electrode has a surface, the semiconductor body has a cathode-side surface outside the cathode electrode being beveled at an angle of greater than 0° and less than 10° from the surface of the cathode electrode, and the anode electrode has an edge opposite the surface.

In accordance with a further feature of the invention, the cathode electrode has a surface, the semiconductor body has an edge and a peripheral region between the cathode electrode and the edge of the semiconductor body, the peripheral region is beveled at an angle of between 20 and 60° from the surface of the cathode electrode, and the anode electrode has an edge being opposite the peripheral region.

In accordance with an added feature of the invention, there is provided an insulating envelope covering the semiconductor body outside the electrodes.

In accordance with an additional feature of the invention, at least the anode electrode is joined to the semiconductor body by pressure sintering or diffusion welding.

In accordance with a concomitant feature of the invention, the insulating envelope is applied prior to mounting of the anode electrode.

Other features which are considered as characteristic for the invention are set forth in the appended claims.

Although the invention is illustrated and described herein as embodied in a power semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
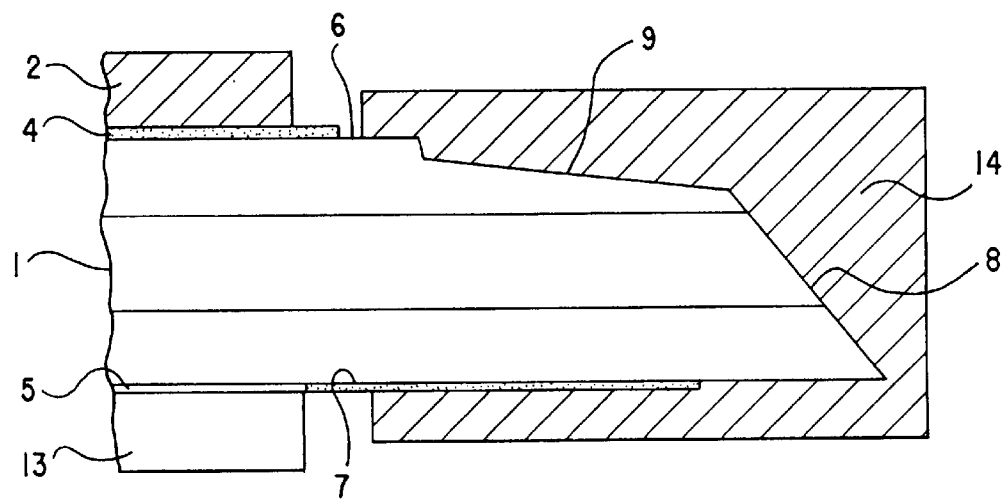
FIG. 2 is a fragmentary, longitudinal-sectional view of a power semiconductor component according to the prior art.

Referring now to the figures of the drawing in detail and first, particularly, to FIG. 2 thereof, there is seen a power semiconductor component which has a semiconductor body 1 that is contacted electrically through a cathode electrode 2 and an anode electrode 13. The contacts are typically of molybdenum. A metal layer 4 is applied to a cathode-side surface 6, and a metal layer 5 is applied to an anode-side surface 7. The metal layers contain a metal or a metal alloy, which effects a diffusion soldering or sintered connection between the electrodes 2, 13 and the semiconductor body 1 under pressure and relatively low temperature. Regarding the technique of joining by sintering, reference is made, for instance, to the aforementioned Published European Patent Application 0 242 626 A2, corresponding to U.S. Pat. No. 4,810,672, and regarding the technique of diffusion soldering, reference is made, for instance, to the aforementioned German Published, Non-Prosecuted Application DE 36 33 266 A1. There is accordingly no need to describe the individual method steps herein.

The electrodes 2, 13 are congruent. In other words, they have the same diameter and are mounted opposite one another. The cathode-side surface 6 has a peripheral region 9 that is beveled at a negative angle. This angle is typically greater than 0° and less than 10°. An edge of the semiconductor body additionally has a surface 8 which is beveled at a positive angle. The beveling angle in this case is generally between 20° and 60°. The edge of the semiconductor body is surrounded by an insulating envelope or sheath 14, for instance of silicone rubber, which also covers a portion of the cathode-side surface 6, the peripheral region 9, the peripheral surface 8, and a portion of the anode-side surface 7.

The edge of the semiconductor body of the power semiconductor component of FIG. 2 is cooled only through a lateral dissipation of heat to the electrode 2 and the electrode 13. The current-carrying capacity of this semiconductor component is therefore diminished.

Figure 1:
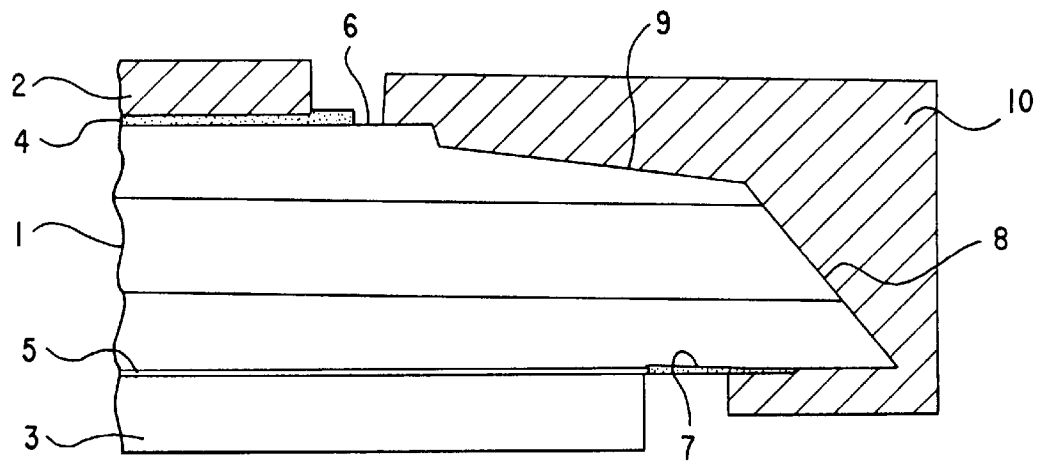
FIG. 1 is a fragmentary, diagrammatic, longitudinal-sectional view of an exemplary embodiment of a power semiconductor component according to the invention.

The semiconductor component according to the invention which is shown in FIG. 1, differs from that of FIG. 2 primarily in that it has an anode electrode 3 with a diameter which is greater than that of the cathode electrode 2. However, for production reasons, the anode electrode 3 does not extend as far as the edge of the semiconductor body but rather ends below the beveled region 9. It can also extend to beneath the beveled edge 8. As a result, cooling of the semiconductor body can be improved decisively. This increases the current-carrying capacity.

The electrodes 2, 3 which are of different sizes are mounted by diffusion welding or pressure sintering. Through the use of suitable pressure-exerting devices, such as elastic inlays, the ensuing bending stress on the semiconductor body can be reduced to an amount that presents no danger to the semiconductor body. Expediently, an envelope 10 is applied prior to the mounting of the electrodes. If it is of silicone rubber, for instance, then it can also be used to make the pressure exerted more uniform.

In contrast to FIG. 2, the anode electrode 3 which is larger than the cathode electrode 2 requires an asymmetrical insulating envelope. This element is identified by reference numeral 10. The insulating layer may, as noted, be of silicone rubber, which covers all of the pn junctions of the semiconductor body that occur at the surface. The metal layer 5 applied to the anode-side surface 7 can be covered by the rubber. Exact adjustment between the rubber and the metal layer thus becomes unnecessary.

It has been noted that in the exemplary embodiment both the cathode electrode 2 and the anode electrode 3 are joined to the semiconductor body by diffusion soldering or pressure sintering. It is also possible, however, to employ these methods only on the anode side. Moreover, it is possible to use the invention in a power semiconductor component having a cathode-side peripheral surface 9 which is not inclined at an angle of between 0° and 10° relative to the surfaces of the electrodes. Instead, the peripheral surface 9 can extend parallel to the main surface of the electrodes, if the depletion capability of the edge is adjusted, for instance by way of graduated diffusions (planar edge).

I claim:

1. A power semiconductor component, comprising:

a semiconductor body having a peripheral surface;

a cathode electrode and an anode electrode; and a materially joined connection between at least said anode electrode and said semiconductor body, said connection not being produced by alloying;

said anode electrode having a diameter being greater than said cathode electrode and smaller than said semiconductor body;

an insulating envelope covering said peripheral surface, parts of a cathode-side surface and an anode-side surface of said semiconductor and being formed before at least one of said electrodes is applied to said semiconductor body.

2. The power semiconductor component according to claim 1, wherein said cathode electrode has a surface, said semiconductor body has a cathode-side surface outside said cathode electrode being beveled at an angle of greater than 0° and less than 10° from said surface of said cathode electrode, and said anode electrode has an edge opposite said surface.

3. The power semiconductor component according to claim 1, wherein said cathode electrode has a surface, said semiconductor body has an edge and a peripheral region between said cathode electrode and said edge of said semiconductor body, said peripheral region is beveled at an angle of between 20 and 60° from said surface of said cathode electrode, and said anode electrode has an edge being opposite said peripheral region.

4. The power semiconductor component according to claim 1, including an insulating envelope covering said semiconductor body outside said electrodes.

5. The power semiconductor component according to claim 1, wherein at least said anode electrode is joined to said semiconductor body by pressure sintering or diffusion welding.

6. The power semiconductor component according to claim 4, wherein said insulating envelope is applied prior to mounting of said anode electrode.

* * * * *